United States Patent
Odai et al.

(10) Patent No.: US 10,452,050 B2
(45) Date of Patent: Oct. 22, 2019

(54) POSITIONING SYSTEM

(71) Applicant: HITACHI, LTD., Chiyoda-ku, Tokyo (JP)

(72) Inventors: Masaki Odai, Tokyo (JP); Tomohiro Inoue, Tokyo (JP); Isao Takahira, Tokyo (JP); Hiroshi Ikeda, Tokyo (JP)

(73) Assignee: HITACHI, LTD., Tokyo (JP)

( * ) Notice: Subject to any disclaimer, the term of this patent is extended or adjusted under 35 U.S.C. 154(b) by 348 days.

(21) Appl. No.: 15/319,053

(22) PCT Filed: Jun. 18, 2014

(86) PCT No.: PCT/JP2014/066093
§ 371 (c)(1),
(2) Date: Dec. 15, 2016

(87) PCT Pub. No.: WO2015/193985
PCT Pub. Date: Dec. 23, 2015

(65) Prior Publication Data
US 2017/0115654 A1   Apr. 27, 2017

(51) Int. Cl.
*G05B 19/402* (2006.01)
*H05K 13/08* (2006.01)
*G05B 23/02* (2006.01)

(52) U.S. Cl.
CPC ....... *G05B 19/402* (2013.01); *G05B 23/0208* (2013.01); *H05K 13/08* (2013.01); *H05K 13/089* (2018.08); *H05K 13/0815* (2018.08); *G05B 2219/36414* (2013.01); *G05B 2219/37563* (2013.01)

(58) Field of Classification Search
CPC .................................................. G05B 19/402
See application file for complete search history.

(56) References Cited

U.S. PATENT DOCUMENTS

2013/0203320 A1 * 8/2013 Ghalambor ............. B24C 1/083
451/2

FOREIGN PATENT DOCUMENTS

| JP | 2004-301620 A | 10/2004 |
| JP | 2006-324424 A | 11/2006 |
| JP | 2014-057032 A | 3/2014 |
| WO | WO 2013/161878 A1 | 10/2013 |

* cited by examiner

*Primary Examiner* — Yu-Hsi D Sun
(74) *Attorney, Agent, or Firm* — Miles & Stockbridge PC

(57) ABSTRACT

A positioning unit that performs positioning with respect to a predetermined sample, an imaging unit that obtains an image of the sample, and a processing unit, in which the imaging unit is moved by the positioning unit, and obtains a first image and a second image which is obtained later than the first image, and in which the processing unit obtains a first position shift trend from the first image and the second image, and determines whether or not the positioning is abnormal from a change of the first position shift trend.

14 Claims, 10 Drawing Sheets

[Fig. 1]
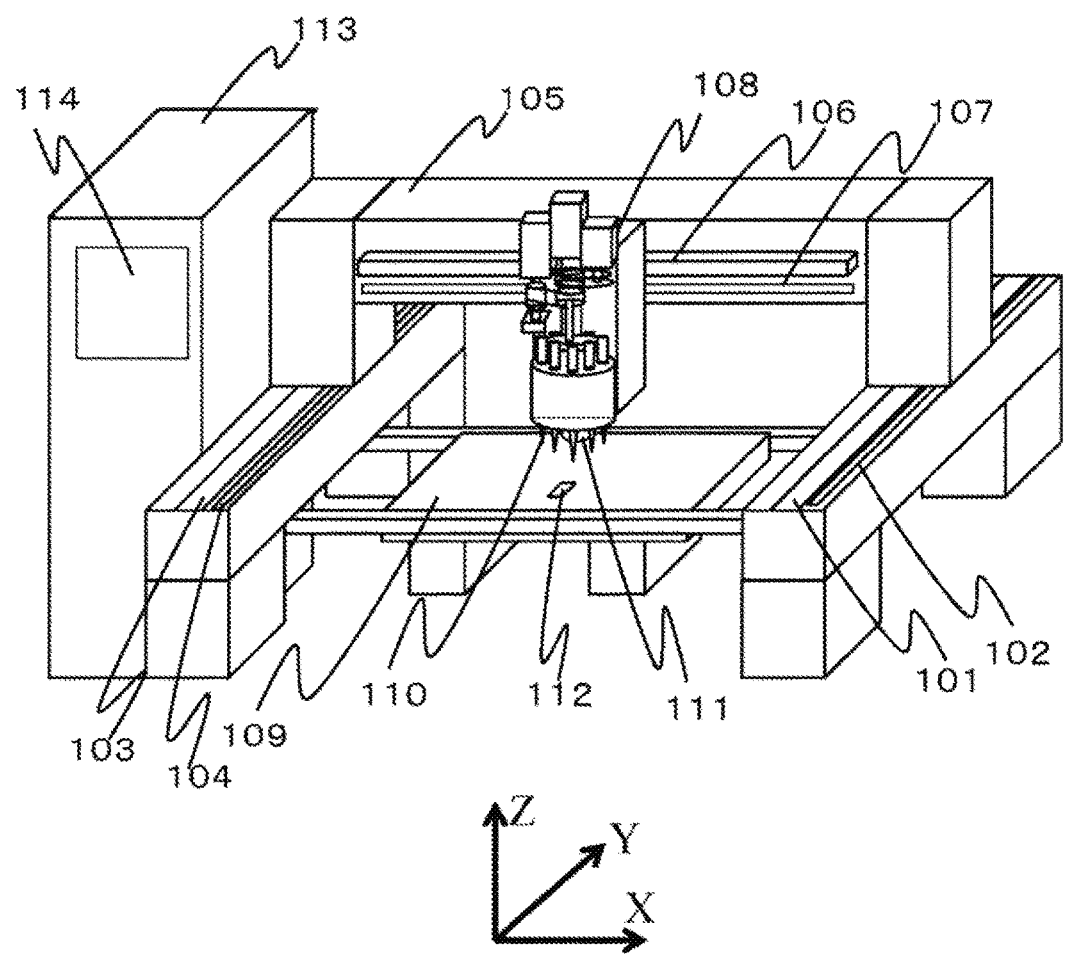

[Fig. 2]
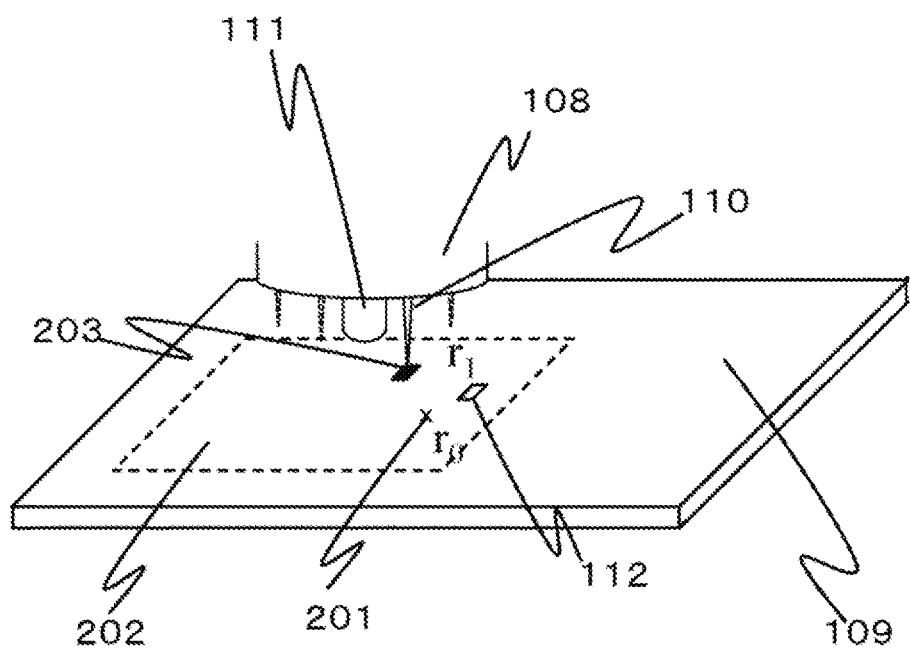

[Fig. 3]
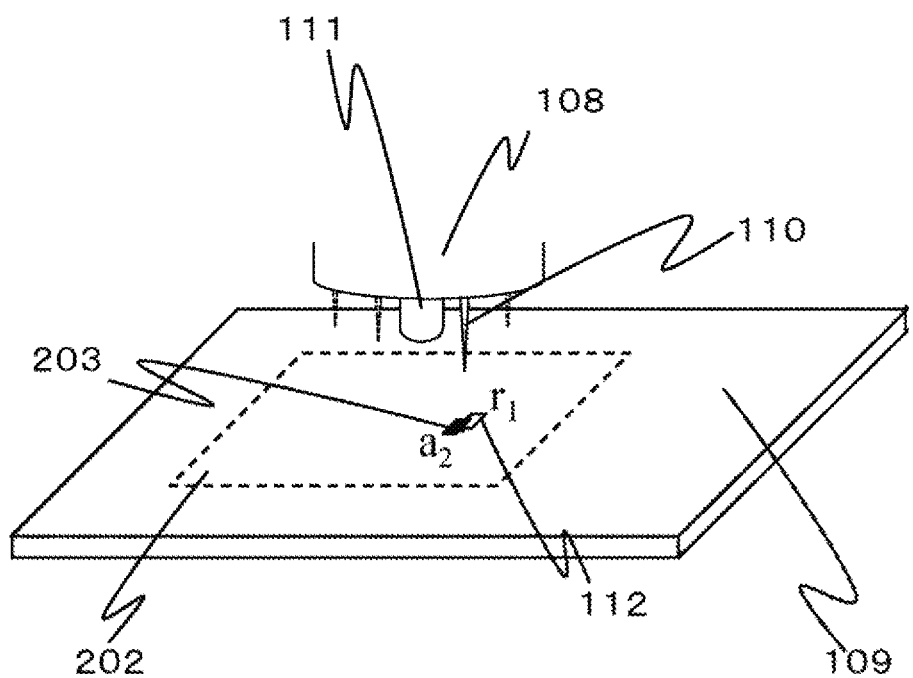

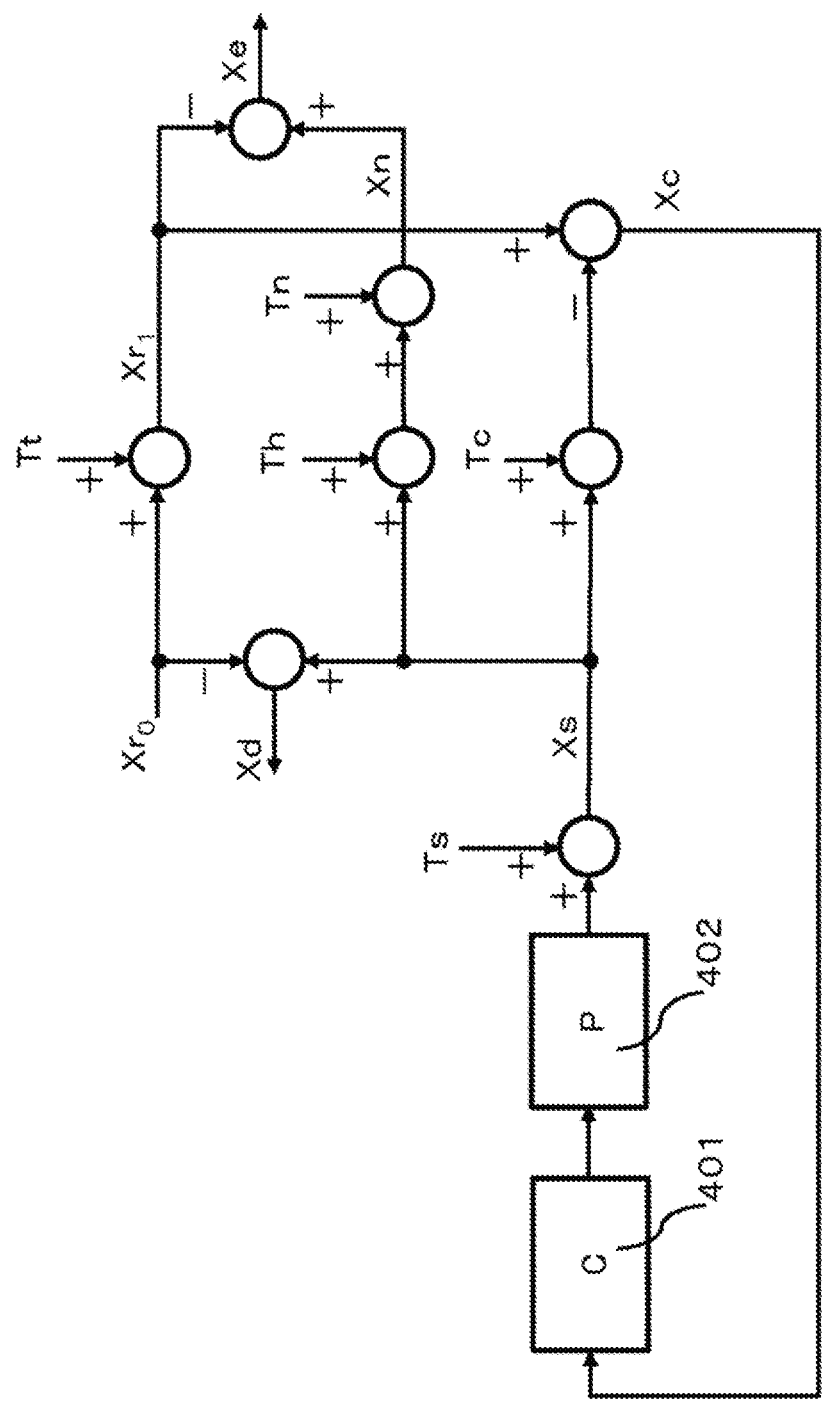
[Fig. 4]

[Fig. 5]
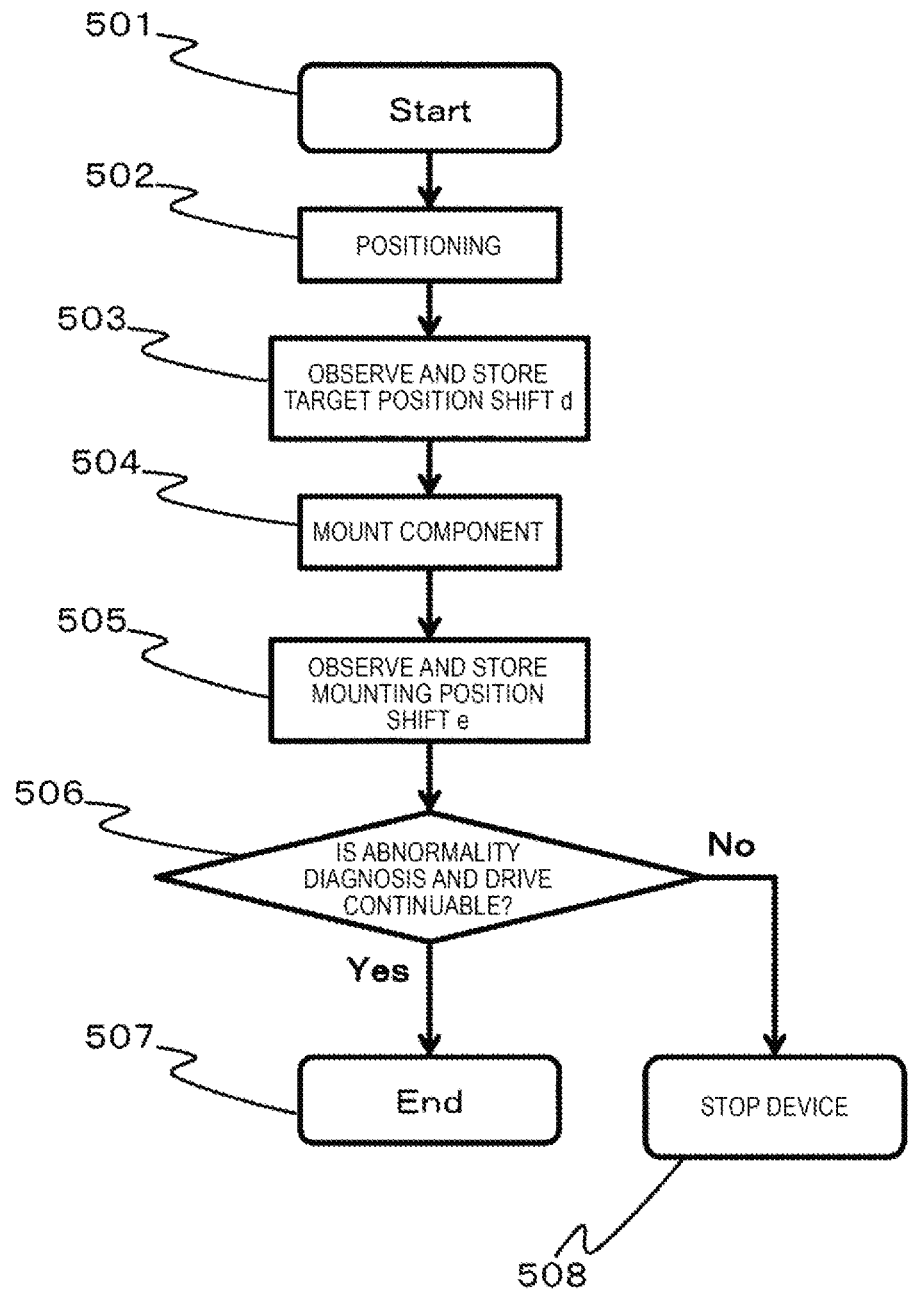

[Fig. 6]
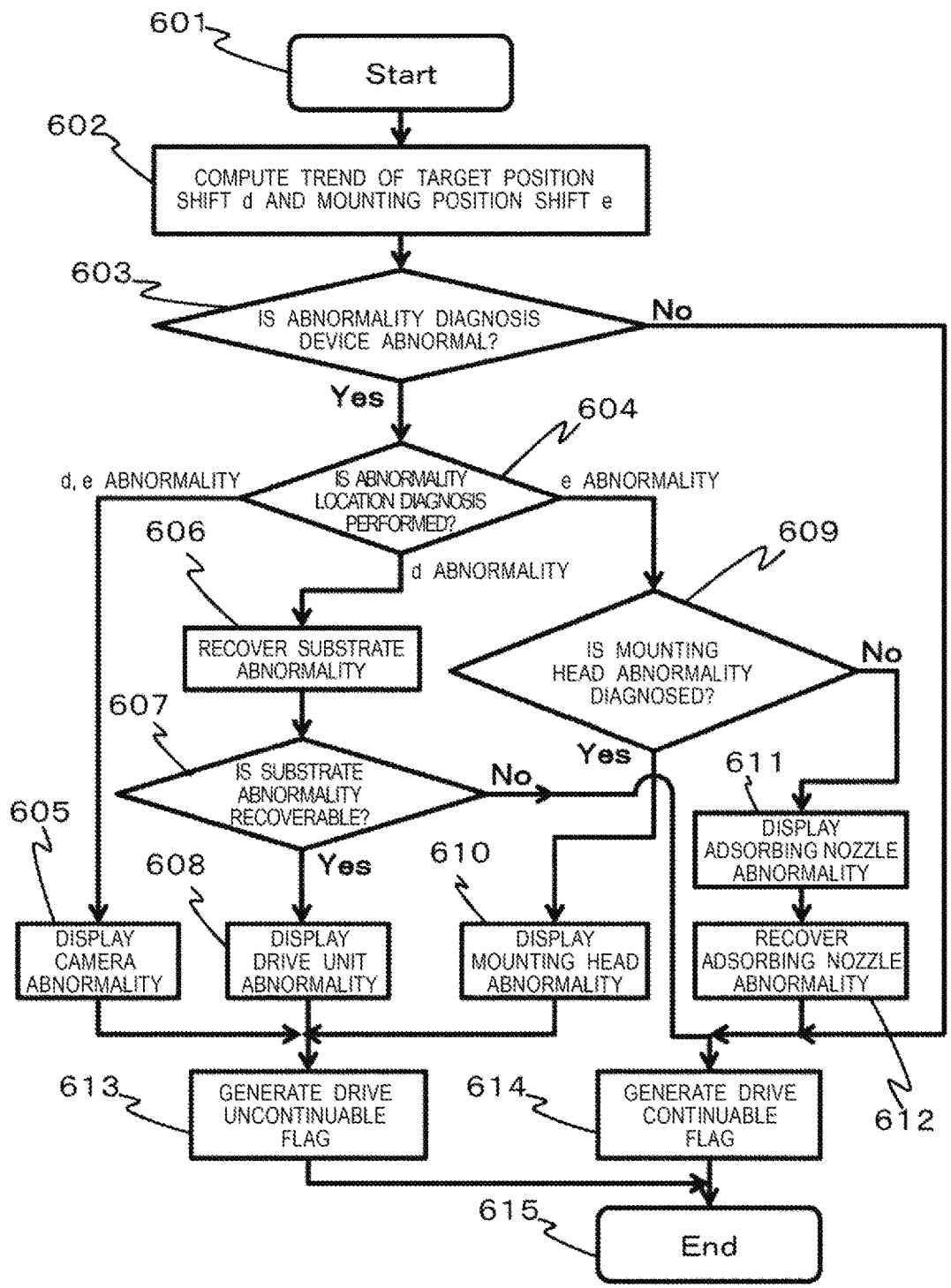

[Fig. 9]

$$d = r_1 - r_0 \quad \cdots \quad \text{EQUATION 1}$$

$$d = a_1 - r_0 \quad \cdots \quad \text{EQUATION 2}$$

$$e = a_2 - r_1 \quad \cdots \quad \text{EQUATION 3}$$

[Fig. 10]

$$Xs = \frac{C \cdot P}{1+C \cdot P}(Xr_0 + Tt + Tc) + \frac{1}{1+C \cdot P} \cdot Ts$$
$$= \frac{C \cdot P}{1+C \cdot P}(Xr_1 + Tc) + \frac{1}{1+C \cdot P} \cdot Ts \quad \cdots \text{EQUATION 4}$$

$$Xa_1 = Xs\big|_{t \to \infty}$$
$$= Xr_0 + Tt + Tc \quad \cdots \text{EQUATION 5}$$
$$= Xr_1 + Tc$$

$$Xd = Xa_1 - Xr_0$$
$$= Tt + Tc \quad \cdots \text{EQUATION 6}$$

[Fig. 11]

$$Xc = \frac{1}{1+C \cdot P}(Xr_0 + Tt) - \frac{1}{1+C \cdot P}(Ts + Tc)$$

$$= \frac{1}{1+C \cdot P} \cdot Xr_1 - \frac{1}{1+C \cdot P}(Ts + Tc) \quad \cdots \text{ EQUATION 7}$$

$$Xc\bigg|_{t \to \infty} = 0 \quad \cdots \text{ EQUATION 8}$$

[Fig. 12]

$$Xn = Xs + Th + Tn \quad \cdots \text{ EQUATION 9}$$

$$Xa_2 = Xn\bigg|_{t \to \infty}$$
$$= Xa_1 + Th + Tn$$
$$= Xr_1 + Tc + Th + Tn \quad \cdots \text{ EQUATION 10}$$

$$Xe = Xa_2 - Xr_1$$
$$= Tc + Th + Tn \quad \cdots \text{ EQUATION 11}$$

POSITIONING SYSTEM

TECHNICAL FIELD

The present invention relates to a positioning system which determines a relative position between a predetermined target and a certain configuration, and an image processing system which is used for the positioning system. Particularly, the present invention relates to an abnormality diagnosing device and an abnormality diagnosing method which are used for a positioning system.

BACKGROUND ART

Since a component mounting device positions a component which is held by a nozzle with respect to a substrate, the component mounting device can be represented as an example of a positioning system.

In a component mounting device, mounting positions of components are made more accurate so as to increase the density of the components and to miniaturize the components.

PTL 1 is provided as related art. PTL 1 discloses mounting a camera on a head including a nozzle and performing positioning of the nozzle with respect to a mounting position.

CITATION LIST

Patent Literature

PTL 1: International Publication No. 2013/161878

SUMMARY OF INVENTION

Technical Problem

The following description will be made for ease of understanding by those skilled in the art easily understand, and is not intended to limit the present invention unnecessarily.

In PTL 1, a position of a substrate in which a component will be mounted is directly observed, and thereby, hindrance factors for positioning, such as distortion, thermal expansion, or deformation of a device can be corrected. Thereby, it is possible to perform accurate mounting of a component.

However, in addition to the aforementioned hindrance factors, there is also a case where, for example, failures of a positioning system side, for example, abnormal deformation of a device are superimposed on each other, in a positioning system. Furthermore, there is also a case where a camera for positioning fails itself.

The related art does not consider distinguishing of hindrance factors of the positioning system side or a plurality of hindrance factors.

Solution to Problem

The present invention includes, for example, at least one of the following aspects.

The present invention moves an imaging unit which is exemplified as a camera, and obtains a trend of position shift from an image which is obtained by the imaging unit, more specifically from an image which is obtained at a different time.

The present invention determines whether or not there is an abnormality from the obtained trend, and identifies a type of the abnormality.

The present invention has at least one of the following effects. (1) The present invention can reduce a period for the positioning system to recover from occurrence of an abnormality of a positioning system. That is, it is possible to prevent productivity from being reduced. (2) According to the present invention, it is possible to reduce the number of failed substrates.

BRIEF DESCRIPTION OF DRAWINGS

FIG. 1 is an example of a schematic view of a component mounting apparatus.

FIG. 2 is an example of a schematic view of positioning which uses image information.

FIG. 3 is an example of a schematic view illustrating a mounted state.

FIG. 4 is an example of a block line diagram of a positioning control system which uses the image information.

FIG. 5 is an example of a flowchart illustrating an operation of component mounting.

FIG. 6 is an example of a flowchart of abnormality diagnosis.

FIG. 9 is a diagram illustrating Equation 1 to Equation 3.

FIG. 10 is a diagram illustrating Equation 4 to Equation 6.

FIG. 11 is a diagram illustrating Equation 7 and Equation 8.

FIG. 12 is a diagram illustrating Equation 9 to Equation 11.

DESCRIPTION OF EMBODIMENTS

Figure 7A:
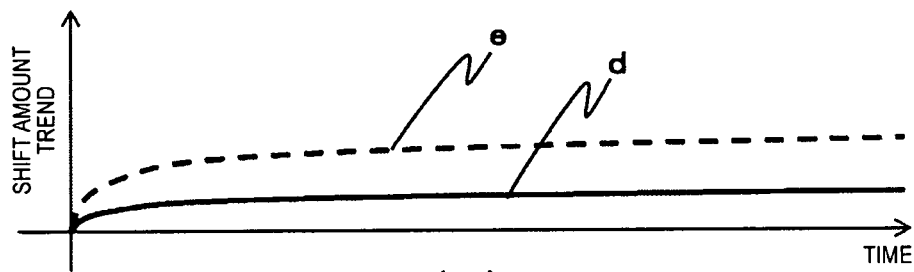
FIGS. 7(a) to 7(d) are examples of time variation of a shift amount trend.

Hereinafter, embodiments will be described with respect to the drawings.

Embodiment 1

FIG. 1 is a schematic diagram of a component mounting apparatus according to the present embodiment. The component mounting apparatus is an example of a positioning system which determines a relative position between a predetermined target and a certain configuration.

In FIG. 1, a Y beam 105 which moves in a Y-axis direction of the figure is driven and positioned by two Y linear motors 101 and 103 in the Y-axis direction. In the same manner, a mounting head 108 which is an example of a work unit is driven and positioned by an X linear motor 106 in an X-axis direction with respect to the Y beam 105. Thereby, the mounting head 108 is freely positioned in an XY plane. The mounting head 108 includes a plurality of adsorbing nozzles 110, and each adsorbing nozzle 110 adsorbs a component to hold, is driven in a Z direction, and mounts the component in a position of a mounting target 112 on a substrate 109. For example, the Y beam 105, the Y linear motors 101 and 103, and the X linear motor 106 can be represented as an example of a positioning system.

The mounting head 108 is driven and positioned by using positional information on the mounting target 112 which is obtained from a captured image of a camera 111 that is an example of a imaging unit included in the mounting head 108, in addition to Y-axis positional information which is obtained by Y encoders 102 and 104, and X-axis positional information is obtained by an X encoder 107.

Movement of the mounting head 108 and the adsorbing nozzle 110 which is necessary for component mounting is performed by a control device 113. The control device 113 includes a memory and a processor, performs computation for controlling the component mounting device including those illustrated in FIG. 6, and performs commanding to each configuration.

A display unit 114 notifies an operator of drive situations, a mounting state, information on an abnormality of a device, or the like. Here, the display unit 114 has object for notifying the operator, and thus, may notify the operator in a remote location using communication means without configuration of a device itself.

The control device 113 and the display unit 114 may be connected to other configurations through a wire network, or may be connected to the other configuration through a wireless network. The control device 113 and the display unit 114 may be a portable terminal. The display unit 114 includes an input interface which is used for work of an operator.

FIG. 2 is a schematic view illustrating an example of positioning which uses image information. The mounting head 108 moves a component 203 adsorbed to the adsorbing nozzle 110 to a designated mounting command position 201(r0), using positional information of the X encoder 107 and the Y encoders 102 and 104.

At this time, the mounting target 112 is shifted to a position r1 of coordinates of the encoder due to positioning hindrance factors, such as shift or deformation of the substrate 109. Here, a target position shift amount d is obtained by Equation 1 at this time.

The camera 111 observes the mounting target 112 in a field of view 202, and detects the position r1 of the mounting target 112. Control algorithm in the control device 113 corrects the target position shift amount d and positions the mounting head 108 to the position r1. Thereby, accurate mounting can be performed.

Here, a position a1 which is positioned by using the image information is the position r1 of the mounting target 112, and can be observed by the X encoder 107 and the Y encoders 102 and 104 after the mounting head 108 is positioned. Hence, the target position shift amount d can be calculated by Equation 2.

FIG. 3 is a schematic view illustrating an example of a mounted state. The mounting head 108 performs positioning to the position r1 of the mounting target 112, and thereafter, mounts the component 203 on the substrate 109 by driving the adsorbing nozzle 110 in a Z-axis direction. At this time, a position a2 where the component 203 is mounted is shifted from the mounting target position r1, due to deformation or the like of the mounting head 108 or the adsorbing nozzle 110. A mounting position shift amount e between the position a2 where a component is mounted and the position target position r1 is obtained by Equation 3. Here, the mounting position shift amount e can be observed by the camera 111 after the component 203 is mounted.

FIG. 4 is an example of a block line diagram of an X-axis positioning control system which uses the image information. FIG. 4 illustrates only an X-axis direction, but can also be applied to a Y-axis in the same manner.

X-axis components Xr1 in the position r1 of the mounting target 112 are shifted only by substrate shift disturbance Tt due to shift or deformation of the substrate 109, with respect to X-axis components Xr0 of a mounting command position r0. Hence, it is assumed that an object of the positioning control system positions the adsorbing nozzle 110 to the mounting target X-axis position Xr1. The camera 111 detects an X-axis position deviation Xc of an image between the mounting target 112 in the field of view 202 and a current position, and feeds back the detected deviation to a controller C401. The controller C401 performs control computation, and inputs a command to an X-axis control target P402, thereby driving the mounting head 108 in the X-axis direction.

A detection position Xs of the X encoder 107 is affected by mechanism deformation disturbance Ts. Camera mechanism deformation disturbance Tc due to deformation or the like of a mechanism existing between the camera 111 and the X encoder 107 shifts the field of view 202 of the camera 111. Thus, it is assumed that the X-axis position deviation Xc of an image is a relative deviation of a position of the camera which is obtained by adding the camera mechanism deformation disturbance Tc to the detection position Xs of the X encoder 107 with respect to the mounting target X-axis position Xr1.

A mechanism, such as the mounting head 108, the adsorbing nozzle 110, or a support portion of the mounting head or the adsorbing nozzle is provided in the detection position Xs of the X encoder and a tip of the adsorbing nozzle 110 holding the component 203. Accordingly, mounting head deformation disturbance Th or adsorbing nozzle deformation disturbance Tn is applied to the detection position Xs of the X encoder in an X-axis direction Xa2 of the mounting position a2. Here, the amount of state which can be directly observed during positioning control is the detection position Xs of the X encoder and the X-axis position deviation Xc of an image. In addition, the mounting command X-axis position Xr0 is known for a command value in advance. Equation 4 is response characteristics of the detection position Xs of the X encoder.

Equation 5 is characteristics of the detection position Xs of the X encoder, that is, the positioning position a1 in an X-axis direction Xa1 when infinite time elapse of Equation 4 is performed. The positioning control system which uses the image information makes the detection position Xs of the X encoder follow mounting target X-axis position Xr1, using Equation 5. In addition, effects of the mechanism deformation disturbance Ts can be compressed to be removed. However, the camera mechanism deformation disturbance Tc is left.

At this time, X-axis components Xd of the target position shift amount dare obtained by Equation 6. That is, the target X-axis position shift amount Xd includes information of the substrate shift disturbance Tt and the camera mechanism deformation disturbance Tc.

Equation 7 is response characteristics of the X-axis position deviation Xc of an image.

Equation 8 is the X-axis position deviation Xc of an image when the infinite time elapse of Equation 7 is performed. The positioning control system which uses the image information performs control such that the X-axis position deviation Xc of an image is zero.

Equation 9 is response characteristics of an X-axis position Xn of the adsorbing nozzle 110.

Equation 10 is X-axis components Xa2 of the position a2 of the mounted component 203. Here, a component mounting X-axis position Xa2 is the X-axis position Xn of the adsorbing nozzle when the infinite time elapse of Equation 9 is performed. The component mounting X-axis position Xa2 follows the mounting target X-axis position Xr1 from Equation 10. However, the camera mechanism deformation disturbance Tc, the mounting head mechanism deformation disturbance Th, and the adsorbing nozzle deformation disturbance Tn are left.

From this, for example, the positioning control system which uses the image information illustrated in FIG. 4 detects at least the camera mechanism deformation disturbance Tc, the mounting head mechanism deformation disturbance Th, and the adsorbing nozzle deformation disturbance Tn, and needs to notify an operator of the disturbances as a device abnormality which deteriorates positioning accuracy.

Equation 11 is X-axis components Xe of the mounting position shift amount e. Mounting X-axis position shift amount Xe includes information of the camera mechanism deformation disturbance Tc, the mounting head mechanism deformation disturbance Th, and the adsorbing nozzle deformation disturbance Tn. The mounting X-axis position shift amount Xe can be observed by the camera 111 after the component 203 is mounted.

Here, FIG. 4 illustrates an example of the positioning control system which uses the image information, and a configuration of the control system is not limited to FIG. 4. For example, the controller C401 may receive the detection position Xs of the X encoder 107.

Here, the substrate shift disturbance Tt, the camera mechanism deformation disturbance Tc, the mounting head mechanism deformation disturbance Th, and the adsorbing nozzle deformation disturbance Tn, which are the positioning hindrance factors change slowly due to thermal deformation even in a case where there is no device abnormality. Meanwhile, for example, when there is the device abnormality in a case where restraint of a support portion of the camera 111 is loose, or the like, the camera mechanism deformation disturbance Tc changes at a time constant less than thermal deformation.

Hence, in a case where a disturbance change occurs at a time constant less than a time constant of a disturbance change due to normal thermal deformation or the like, an operator is notified of the disturbance change as a device abnormality, and stops a device if necessary. The device abnormality may be set to have a time constant equal to or less than a time constant which is A times (A is less than 1) a normal disturbance change. In addition, a time constant of a disturbance change within a past prescribed time may be used for a time constant which is a reference.

FIG. 5 is an example of a flowchart according to the present embodiment with regard to mounting of one component 203. The mounting of the component 203 starts from a start flow 501, the camera 111 moves to the predetermined mounting target 112 in a positioning flow 502, and positioning is performed by using image information which is captured by the camera 111.

The target position shift amount d at the time of positioning is observed and stored in a target position shift storage flow 503.

In a component mounting flow 504, the component 203 which is held by the adsorbing nozzle 110 is mounted in the mounting target 112. In a mounting position shift storage flow 505, the mounting position shift amount e is observed by the camera 111 and stored.

In an abnormality diagnosis flow 506, a device abnormality is diagnosed. Ina case where it is diagnosed that drive can be continued in the abnormality diagnosis flow 506, the processing proceeds to an end flow 507, and then the processing returns to the start flow 501 so as to mount a subsequent component 203, and thereby work is continued.

In a case where it is diagnosed that drive cannot be continued in the abnormality diagnosis flow 506, the processing proceeds to a device stop flow 508, and drive of the device stops.

FIG. 6 is an example of a flowchart according to the present embodiment with regard to the abnormality diagnosis flow 506. The abnormality diagnosis flow 506 starts from a start flow 601, and proceeds to a shift trend computation flow 602. The shift trend computation flow 602 computes trends of the target position shift amount d and the mounting position shift amount e, using the target position shift amount d stored in the target position shift storage flow 503 and the mounting position shift amount e stored in the mounting position shift storage flow 505, and stores the computed trend.

Several methods of obtaining the trend are considered. A simplest trend representing method is to perform fitting of the obtained data, using connection or a curve. The trend can be represented as a movement average. The movement average includes a simple movement average in which weighting is not performed with respect to data (d, e in the present embodiment), a weighted movement average in which weighting is performed, an index movement average in which weight changes exponentially, and other movement averages. In order to obtain the trend, parameters can be set arbitrary through the display unit 114 by an operator, and the control device 113 can also be changed by a predetermined program. As a parameter for obtaining the trend, a smoothing coefficient is considered in a case where the trend which is the number of data is the index movement average for example, but may include other parameters.

FIG. 7 is an example of a shift amount trend 4 of the target position shift amount d and the mounting position shift amount e which are computed and stored in the shift trend computation flow 602. Here, a trend of the shift amount includes a past trend to be stored. A time to be stored may provide a prescribed time, and may be shifted from the time when a device starts. Here, the device abnormality is a time constant change less than a disturbance change due to normal deformation such as thermal deformation, and thus, the prescribed time which is stored may be shifted to a time constant equal to or greater than a time constant of a disturbance change due to normal deformation.

The target position shift amount d can be represented as first position shift amount. In addition, in order to obtain a trend of the target position shift amount d, at least two images are required, and an image required for obtaining the trend of the target position shift amount d can be represented to include a first image and a second image obtained later than the first image.

The mounting position shift amount e can be represented as second position shift amount. In addition, in order to obtain a trend of the target position shift amount e, at least two images are required, and an image required for obtaining the trend of the target position shift amount e can be represented to include a third image and a fourth image obtained later than the third image.

In addition, the target position shift amount d is obtained before mounting is performed, and thus, the first image can be represented as an image which is obtained before the mounting head 108 that is an example of a work unit performs work at a first position on a substrate that is an example of a sample, and the second image can be represented as an image which is obtained before the work unit performs work at a second position different from the first position.

In addition, the mounting position shift amount e is obtained after mounting is performed, and thus, the third image can be represented as an image which is obtained after a work unit performs work at the first position, and the fourth image can be represented as an image which is obtained after the work unit performs work at the second position.

The abnormality diagnosis flow 602 diagnoses whether or not there is a change abrupter (time constant is less than a predetermined value) than a predetermined slope in the shift amount trend stored in the shift trend computation flow 601. In a case where there is no abrupt change as illustrated in FIG. 7(a), it is determined that there is no device abnormality, a drive continuable flag is generated in a drive continuable flag generation flow 614, and thereafter the processing proceeds to an end flag 615, and the abnormality diagnosis flow 506 end.

Figure 7B:
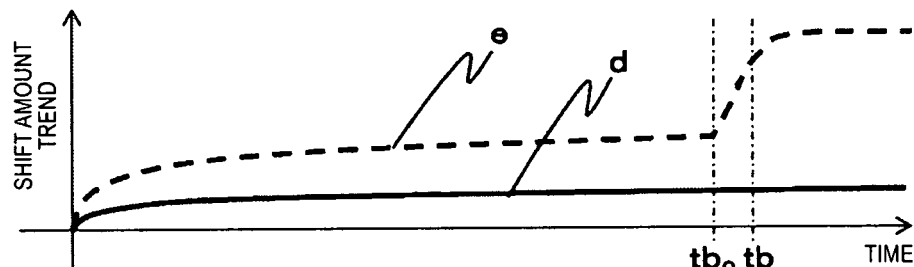

Meanwhile, in a case where none of the target position shift amount d and the mounting position shift amount e has no abrupt change in the shift amount trend as illustrated in FIGS. 7(b), (c), and (d), it is determined that there is a device abnormality, and the processing proceeds to an abnormality location diagnosis flow 604.

The abnormality location diagnosis flow 604 is divided into three abnormality locations by the shift amount trend in which an abrupt change is made.

Figure 7C:
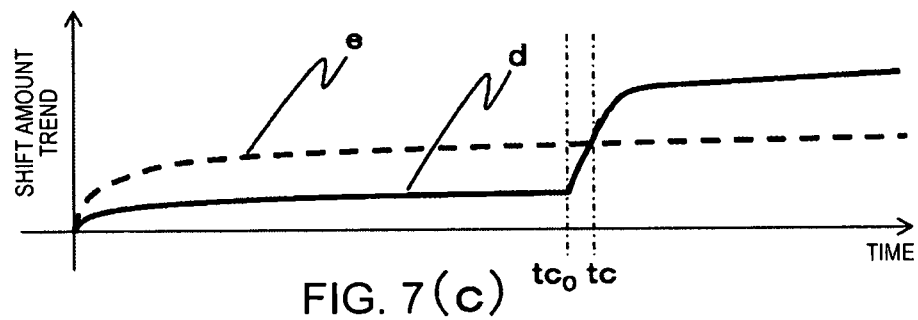
Figure 7D:
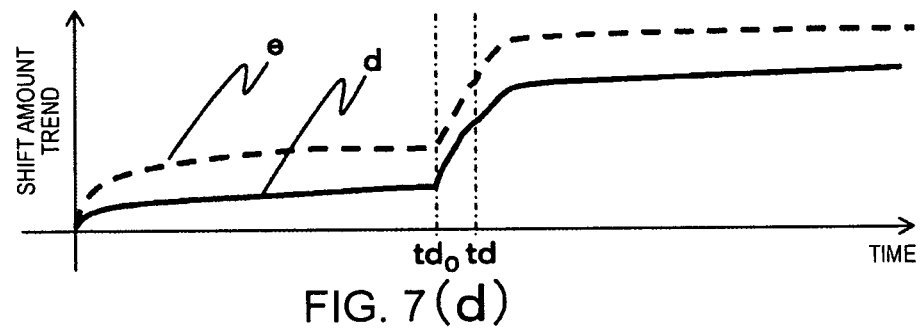

As illustrated in FIG. 7(d), in a case where abrupt changes of both target position shift d and mounting position shift e are observed at the same time td, the processing proceeds to a camera abnormality display flow 605. Here, it can be seen that changes of both the target position shift d and the mounting position shift e depend upon the camera mechanism deformation disturbance Tc from Equation 6 and Equation 11. Hence, in a case where FIG. 7(d), that is, abrupt changes of both the target position shift d and the mounting position shift e are observed at the same time, it is specified that a camera 111 mechanism is abnormal. The abnormality of the camera 111 mechanism means that accurate positioning cannot be performed by using the image information, and thus, it is necessary to stop a device by notifying an operator of the device abnormality. Here, in the camera abnormality display flow 605, occurrence of the abnormality of the camera 111 mechanism is displayed on the display unit 114, and the processing proceeds to a drive uncontinuable flag generation flow 613. In the drive uncontinuable flag generation flow 613, a drive uncontinuable flag is generated, and thus, the processing proceeds to the device stop flow 508, thereby stopping the device.

As illustrated in FIG. 7(c), when only an abrupt change of the target position shift d is observed, the processing proceeds to a substrate abnormality recovering flow 606. Here, it can be seen that only the change of the target position shift d depends upon the shift disturbance Tt of the substrate 109 from Equation 6 and Equation 11. In addition to this, even a case where the component cannot move to the mounting command position 201 due to the abnormality of a drive mechanism system when the positional information of the encoder is used, a change of the target position shift d appears. A drive mechanism system has a structure for moving the mounting head 108, such as the X linear motor 106, the X encoder 107, the Y linear motors 101 and 103, the Y encoders 102 and 104, or the Y beam 105. Hence, when FIG. 7(c), that is, only the abrupt change of the target position shift d is observed, it is specified that the substrate 109 is shifted or the drive mechanism system is abnormal. In the substrate abnormality recovering 606, an operation of correcting the shift of the substrate 109 is performed. The correction of the shift of the substrate 109 can be performed by a method, such as a method of removing the substrate 109 when an abnormality is detected, mounting a new substrate 109, observing the amount of shift of the substrate 109 by observing a characteristic point of the substrate 109, and correcting the amount of shift. In a substrate abnormality recovering confirmation flow 607, it is confirmed whether or not shift of the substrate 109 can be corrected, and in a case where the shift can be corrected, the drive continuable flag can be generated in the drive continuable flag generation flow, and thereby a next component 203 is mounted without stopping a device by proceeding to the end flag 507. In a case where the shift of the substrate 109 cannot be corrected in the substrate abnormality recovering confirmation flow 607, there is a high possibility that the drive mechanism system is abnormal, and thus, the processing proceeds to a drive unit abnormality display flow 608, the abnormality of the drive unit is displayed on the display unit 114, and thereby notifying an operator of the abnormality. The abnormality of the drive mechanism system is an abnormality with a possibility that the device is inoperable. Hence, the drive uncontinuable flag is generated in a drive uncontinuable flag generation flow 613, and thereby the processing proceeds to the device stop flow 508 and the device stops.

As illustrated in FIG. 7(b), when only the abrupt change of the mounting position shift e is observed, the processing proceeds to a mounting head abnormality diagnosis flow 609. Here, it can be seen that only the change of the mounting position shift e depends upon the mechanism deformation disturbance Th of the mounting head 108 or the deformation disturbance Tn of the adsorbing nozzle 110 from Equation 6 and Equation 11. Hence, in a case where FIG. 7(b), that is, only the abrupt change of the mounting position shift e is observed, it is specified that the mounting head 108 or the adsorbing nozzle 110 is abnormal. The mounting head abnormality diagnosis flow 609 specifies which of the mounting head 108 and the adsorbing nozzle 110 causes the abnormality of the mounting position shift e.

Figure 8:
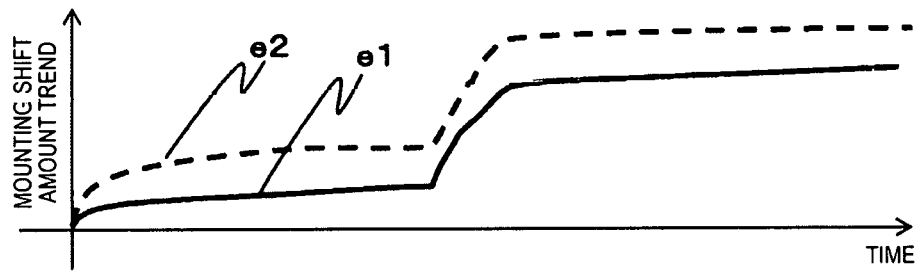
FIGS. 8(a) to 8(b) are examples of time variation of a shift amount trend of mounting position.
Figure 8:
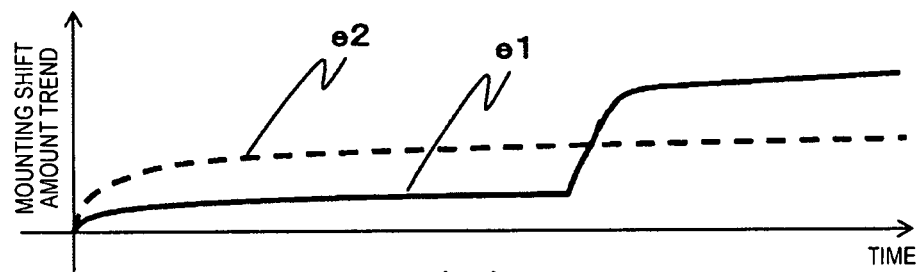

FIG. 8 is an example of a trend of the mounting position shift amount e for each of the adsorbing nozzle 110. FIG. 8 is an example in which two adsorbing nozzles 110 are provided in the mounting head 108.

In the example of FIG. 8(a), abrupt changes of amounting shift amount trend e1 of a first adsorbing nozzle 110 included in the mounting head 108 and a mounting shift amount trend e2 of a second adsorbing nozzle 110 included in the mounting head 108 can be observed at the same time. Here, the mounting head 108 supports all the adsorbing nozzles 110. Hence, in a case where abrupt changes of mounting shift amount e trends of a plurality of the adsorbing nozzles 110 are observed at the same time, the abrupt changes of mounting position shift amount e trends depend on the mounting head mechanism deformation disturbance Th, and it can be specified that the mounting head 108 is abnormal.

In the same manner, in a case where only an abrupt change of the mounting shift amount trend e1 of the first adsorbing nozzle 110 is observed as illustrated in FIG. 8(b), the abrupt change of the mounting position shift amount e trend depends upon the adsorbing nozzle deformation disturbance Tn, and it can be specified that the adsorbing nozzle 110 is abnormal. Furthermore, in the adsorbing nozzle 110 in which the mounting position shift amount e trend abruptly changes, that is, FIG. 8(b), it is also specified that the first adsorbing nozzle 110 is abnormal. In addition, in the same manner, in a case where only the abrupt change of the mounting shift amount trend e2 of the second adsorbing nozzle 110 is observed, the second adsorbing nozzle 110 is abnormal.

Thereby, in the mounting head abnormality diagnosis flow 609, it can be determined which of the mounting head 108 and the adsorbing nozzle 110, and furthermore, which of the adsorbing nozzles 110 is abnormal.

In a case where the mounting head 108 is abnormal, it is impossible to perform accurate positioning mounting, and thus, an abnormality of the mounting head 108 is displayed on the display unit 114, and thereby an operator is notified of the abnormality, in a mounting head abnormality display flow 610. Furthermore, in the drive uncontinuable flag generation flow 613, the drive uncontinuable flag is generated, and thus, the processing proceeds to the device stop flow 508 thereby stopping the device.

In a case where the adsorbing nozzle 110 is abnormal, it is impossible to perform accurate positioning mounting of only the adsorbing nozzle 110 in which an abnormality is specified. Hence, the abnormality of the adsorbing nozzle is displayed on the display unit 114 and the operator is notified of the abnormality, in the adsorbing nozzle abnormality display flow 611, and thereafter, the processing proceeds to an adsorbing nozzle abnormality recovering flow 612. In the adsorbing nozzle abnormality recovering flow 612, preparation for mounting in which the abnormal adsorbing nozzle 110 is not used is performed. During the preparation for mounting in which the abnormal adsorbing nozzle 110 is not used, a method of remaining a component held by the adsorbing nozzle 110, and a method of subtracting the number of abnormal adsorbing nozzles 110 from a number parameter of the adsorbing nozzle 110 included in the mounting head 108 in the control device 113, or the like can be used. Thereafter, the drive continuable flag is generated in a drive continuable flag generation flow 614, and thereby, the processing proceeds to the end flow 507, and a next component 203 is mounted without using the abnormal adsorbing nozzle 110. Thereby, components 203 can be continuously mounted while an abnormality of the adsorbing nozzle 110 is repaired, and thus, it is possible to prevent productivity from being significantly decreasing.

Here, for example, in FIG. 7(d), the abnormality is diagnosed by detection of the abrupt change of the shift amount trend at a time td, but the past shift amount trend is stored as described above. Hence, a time td0 when the abrupt change of the shift amount trend starts can be detected, and thus, a time td0 when the device abnormality occurs can be specified. In addition, the substrate 109 in which a component is mounted after the device abnormality occurs can become a failure by being affected by the device abnormality. Meanwhile, the substrate 109 in which a component is mounted before the device abnormality occurs can have high quality. Hence, the lot number or the like of the substrates 109 in which components are mounted during an occurrence time of the device abnormality or after the device abnormality occurs, is displayed on the display unit 114 and thereby, an operator is notified of the lot number or the like. Thereby, the substrate 109 in which a component is mounted after the device abnormality occurs can be tested or cancelled, and the substrate 109 in which a component is mounted before the device abnormality occurs is shipped after passing through a normal test process. That is, by specifying the occurrence time of the device abnormality, a failed product due to the device abnormality can be selected, and it is possible to prevent the failed product from being shipped and to reduce the lot number to be tested. Here, an example of FIG. 7(d) is described, but FIG. 7(b) and FIG. 7(c) can also employ the same technique.

As described above, embodiments of the present invention are described, but the present invention is not limited to the embodiments. The positioning system has broad meaning which also includes a railroad, an airplane, and a vehicle, in addition to the component mounting device.

REFERENCE SIGNS LIST

101 Y LINEAR MOTOR (RIGHT SIDE)
102 Y ENCODER (RIGHT SIDE)
103 Y LINEAR MOTOR (LEFT SIDE)
104 Y ENCODER (LEFT SIDE)
105 Y BEAM
106 X LINEAR MOTOR
107 X ENCODER
108 MOUNTING HEAD
109 SUBSTRATE
110 ADSORBING NOZZLE
111 CAMERA
112 MOUNTING TARGET
113 CONTROL DEVICE
114 DISPLAY UNIT
201 MOUNTING COMMAND POSITION
202 FIELD OF VIEW
203 COMPONENT
401 CONTROLLER
402 X-AXIS CONTROL TARGET
501 START FLOW (MOUNTING)
502 POSITIONING FLOW
503 TARGET POSITION SHIFT STORAGE FLOW
504 COMPONENT MOUNTING FLOW
505 MOUNTING POSITION SHIFT STORAGE FLOW
506 ABNORMALITY DIAGNOSIS FLOW
507 END FLOW (MOUNTING)
508 DEVICE STOP FLOW
601 START FLOW (ABNORMALITY DIAGNOSIS)
602 POSITION SHIFT TREND COMPUTATION FLOW
603 ABNORMALITY DIAGNOSIS FLOW
604 ABNORMALITY LOCATION DIAGNOSIS FLOW
605 CAMERA ABNORMALITY DISPLAY FLOW
606 SUBSTRATE ABNORMALITY RECOVERING FLOW
607 SUBSTRATE ABNORMALITY RECOVERING CONFIRMATION FLOW
608 DRIVE UNIT ABNORMALITY DISPLAY FLOW
609 MOUNTING HEAD ABNORMALITY DIAGNOSIS FLOW
610 MOUNTING HEAD ABNORMALITY DISPLAY FLOW
611 ADSORBING NOZZLE ABNORMALITY DISPLAY FLOW
612 ADSORBING NOZZLE ABNORMALITY RECOVERING FLOW
613 DRIVE UNCONTINUABLE FLAG GENERATION FLOW
614 DRIVE CONTINUABLE FLAG GENERATION FLOW
615 END FLOW (ABNORMALITY DIAGNOSIS)

The invention claimed is:

1. A positioning system comprising:
   a positioning unit configured to perform positioning of a component mounting head with respect to a predetermined sample;
   an imaging unit configured to capture images of the sample; and a processing unit configured to control said positioning of said positioning unit by outputting commands to said positioning unit based on said image received from said imaging unit, wherein the imaging unit is moved by the positioning unit, and is configured to obtain a first image of said sample and a second image of said sample which is obtained later than the first image, and wherein the processing unit is configured to determine and store a first position shift trend based on the obtained first image and the obtained second image, and to determine whether or not a position of said component mounting head of the positioning system is abnormal based on a change of a position shift slope with respect to a slope of the stored first position shift trend.

2. The positioning system according to claim 1, wherein the imaging unit is further configured to obtain a third image of said sample and a fourth image of said sample which is obtained later than the third image, and wherein the processing unit is further configured to (1) determine and store a second position shift trend different from the first position shift trend based on the obtained third image and the obtained fourth image, (2) determine whether or not a position of said component mounting head of the positioning system is abnormal based on a change of a position shift slope with respect to a slope of the first position shift trend and a change of the position shift slope with respect to a slope of the second position shift trend, and (3) determine a type of the abnormality.

3. The positioning system according to claim 2, wherein, in a case where there are changes in the first position shift trend and the second position shift trend, the processing unit determines that the imaging unit is abnormal.

4. The positioning system according to claim 3, wherein, in a case where there is a change in the first position shift trend and there is no change in the second position shift trend, the processing unit determines that the sample or the positioning unit is abnormal.

5. The positioning system according to claim 4, wherein, in a case where there is a change in the first position shift trend and there is no change in the second position shift trend, the processing unit performs correction of shifting of the sample, and in a case where the correction is not performed, the processing unit determines that the positioning unit is abnormal.

6. The positioning system according to claim 5, wherein the positioning unit includes a work unit which performs work, wherein the work unit is moved by the positioning unit together with the imaging unit, and wherein, in a case where there is no change in the first position shift trend and there is a change in the second position shift trend, the processing unit determines that the work unit is abnormal.

7. The positioning system according to claim 6, wherein the first image is an image which is obtained before the work unit performs work at a first position of the sample, and wherein the second image is an image which is obtained before the work unit performs work at a second position different from the first position.

8. The positioning system according to claim 6, wherein the third image is an image which is obtained after the work unit performs work at the first position, and wherein the fourth image is an image which is obtained after the work unit performs work at the second position.

9. The positioning system according to claim 1, wherein the imaging unit is further configured to obtain a third image of said sample and a fourth image of said sample which is obtained later than the third image, and wherein the processing unit is further configured to (1) determine and store a second position shift trend different from the first position shift trend based on the obtained third image and the obtained fourth image, (2) determine whether or not a position of said component mounting head of the positioning system is abnormal based on a change of a position shift slope with respect to a slope of the first position shift trend and a change of the position shift slope with respect to a slope of the second position shift trend, and (3) determine a type of the abnormality, and (4) determine that the imaging unit is abnormal in a case where there are changes in the first position shift trend and the second position shift trend.

10. The positioning system according to claim 1, wherein the imaging unit is further configured to obtain a third image of said sample and a fourth image of said sample which is obtained later than the third image, and wherein the processing unit is further configured to (1) determine and store a second position shift trend different from the first position shift trend based on the obtained third image and the obtained fourth image, (2) determine whether or not a position of said component mounting head of the positioning system is abnormal based on a change of a position shift slope with respect to a slope of the first position shift trend and a change of the position shift slope with respect to a slope of the second position shift trend, and (3) determine a type of the abnormality, and (4) determine that the sample or the positioning unit is abnormal in a case where there is a change in the first position shift trend and there is no change in the second position shift trend.

11. The positioning system according to claim 10, wherein, in a case where there is a change in the first position shift trend and there is no change in the second position shift trend, the processing unit performs correction of shifting of the sample, and in a case where the correction is not performed, the processing unit determines that the positioning unit is abnormal.

12. The positioning system according to claim 1, wherein the positioning unit includes a work unit which performs work, wherein the work unit is moved by the positioning unit together with the imaging unit, wherein the imaging unit is further configured to obtain a third image of said sample and a fourth image of said sample which is obtained later than the third image, and wherein the processing unit is further configured to (1) determine and store a second position shift trend different from the first position shift trend based on the obtained third image and the obtained fourth image, (2) determine whether or not a position of said component mounting head of the positioning system is abnormal based on a change of a position shift slope with respect to a slope of the first position shift trend and a change of the position shift slope with respect to a slope of the second position shift trend, and (3) determine a type of the abnormality, and (4) determine that the work unit is abnormal in a case where there is no change in the first position shift trend and there is a change in the second position shift trend.

13. The positioning system according to claim 1,
wherein the first image is an image which is obtained before the work unit performs work at a first position of the sample, and
wherein the second image is an image which is obtained before the work unit performs work at a second position different from the first position.

14. The positioning system according to claim 13,
wherein the imaging unit is further configured to obtain a third image of said sample and a fourth image of said sample which is obtained later than the third image,
wherein the third image is an image which is obtained after the work unit performs work at the first position, and
wherein the fourth image is an image which is obtained after the work unit performs work at the second position.

\* \* \* \* \*